United States Patent [19]

Yamazaki et al.

[11] Patent Number: 5,210,050
[45] Date of Patent: May 11, 1993

[54] METHOD FOR MANUFACTURING A SEMICONDUCTOR DEVICE COMPRISING A SEMICONDUCTOR FILM

[75] Inventors: Shunpei Yamazaki, Tokyo; Hongyong Zhang, Kanagawa, both of Japan

[73] Assignee: Semiconductor Energy Laboratory Co., Ltd., Kanagawa, Japan

[21] Appl. No.: 774,852

[22] Filed: Oct. 11, 1991

[30] Foreign Application Priority Data

Oct. 15, 1990 [JP] Japan ................ 2-277134
Oct. 15, 1990 [JP] Japan ................ 2-277135

[51] Int. Cl.⁵ ................................. H01L 21/203
[52] U.S. Cl. .............................. 437/101; 437/233; 437/234; 148/DIG. 1; 204/192.25
[58] Field of Search ............... 437/101, 233, 234; 204/192.1, 192.23, 192.25; 748/DIG. 1

[56] References Cited

U.S. PATENT DOCUMENTS

| | | | |
|---|---|---|---|
| 4,365,013 | 12/1982 | Ishioka et al. | 430/57 |
| 4,378,417 | 3/1983 | Maruyama et al. | 430/57 |
| 4,591,892 | 5/1986 | Yamazaki | 357/30 |
| 4,597,160 | 7/1986 | Ipzi . | |
| 4,888,305 | 12/1989 | Yamazaki et al. | 437/101 |
| 4,969,025 | 11/1990 | Yamamoto et al. | 357/30 |
| 5,077,223 | 12/1991 | Yamazaki | 437/4 |

FOREIGN PATENT DOCUMENTS 0161555  11/1985  European Pat. Off. .
2-103925  4/1990  Japan ................ 437/101

Primary Examiner—T. N. Quach
Attorney, Agent, or Firm—Sixbey, Friedman, Leedom & Ferguson

[57] ABSTRACT

A high quality semiconductor device comprising at least a semiconductor film having a microcrystal structure is disclosed, wherein said semiconductor film has a lattice distortion therein and comprises crystal grains at an average diameter of 30 Å to 4 μm as viewed from the upper surface of said semiconductor film and contains oxygen impurity and concentration of said oxygen impurity is not higher than $7 \times 10^{19}$ atoms·cm$^{-3}$ at an inside position of said semiconductor film. Also is disclosed a method for fabricating semiconductor devices mentioned hereinbefore, which comprises depositing an amorphous semiconductor film containing oxygen impurity at a concentration not higher than $7 \times 10^{19}$ atoms·cm$^{-3}$ by sputtering from a semiconductor target containing oxygen impurity at a concentration not higher than $5 \times 10^{18}$ atoms·cm$^{-3}$ in an atmosphere comprising hydrogen at not less than 10% in terms of partial pressure; and crystallizing said amorphous semiconductor film at a temperature of from 450° C. to 700° C.

16 Claims, 5 Drawing Sheets

METHOD FOR MANUFACTURING A SEMICONDUCTOR DEVICE COMPRISING A SEMICONDUCTOR FILM

BACKGROUND OF THE INVENTION

1. Field of the Invention

The present invention relates to a semiconductor device comprising at least a semiconductor film accompanying lattice distortion therein, and to a method for manufacturing the same.

2. Description of the Prior Art

Methods for fabricating polycrystalline semiconductor films to use in polycrystalline semiconductor devices include (1) depositing films in the temperature range of from 550° to 900° C. using low pressure CVD (chemical vapor deposition), (2) thermally crystallizing semiconductor films having deposited by low pressure CVD, by annealing the films in the temperature range of from 550° to 650° C. for a duration of from several to several tens of hours, and (3) thermally crystallizing semiconductor films having deposited by plasma-enhanced CVD, by annealing the films in the temperature range of from 550° to 650° C. for a duration of from several to several tens of hours.

However, in depositing a non-single crystal semiconductor film, a reduced pressure CVD method fails to deposit uniformly the film over a large area on a substrate, and a plasma CVD method takes too long a time to deposit the film to a sufficient thickness.

There is also known a method of fabricating thin-film transistors using an amorphous silicon (a-Si) film having deposited by sputtering in the presence of hydrogen, however, the electric characteristics of the resulting thin film are so poor as to yield, e.g., an electron mobility of 0.1 $cm^2/Vsec$ or even lower.

If a non-single crystal semiconductor film is deposited by a sputtering method under an atmosphere free from hydrogen, on the other hand, the resulting film suffers segregation of silicon atoms. Furthermore, it is known that such a film would not undergo thermal crystallization at 700° C. or at any temperature below 700° C., due to the incorporation of impurities such as argon and oxygen atoms or to the lack of hydrogen, or due to both.

SUMMARY OF THE INVENTION

An object of the present invention is to provide a semiconductor device improved in device characteristics.

Another object of the present invention is to provide a method for fabricating a semiconductor device improved in device characteristics.

Further another object of the present invention is to provide a semiconductor device comprising a microcrystalline semiconductor film having a low barrier at the grain boundaries thereof.

Still another object of the present invention is to provide a method for fabricating a semiconductor device comprising a semiconductor film having a low barrier at the grain boundaries thereof.

These and other objects of the present invention have been attained by the use of a semiconductor film having a lattice distortion therein and comprising crystal grains having an average diameter of from 30 Å to 4 μm, preferably from 30 Å to 400 Å, as viewed from the upper surface of said semiconductor film, and containing an oxygen impurity at a concentration of $7 \times 10^{19}$ atoms·$cm^{-3}$ or lower, preferably $1 \times 10^{19}$ atoms·$cm^{-3}$ or lower, inside said semiconductor film. Such a semiconductor film includes a microcrystalline semiconductor film having a microcrystal structure and a polycrystalline semiconductor film. Microscopically, the crystals (grains) in the semiconductor film are more tightly brought into contact with the neighboring crystals (grains) by imparting lattice distortion to each of the crystals (grains). This results in the disappearance of barriers at the grain boundaries and in an enhanced carrier mobility.

The semiconductor film according to the present invention is different from a polycrystalline film free from lattice distortion, since in the latter film, impurities such as oxygen accumulate at the grain boundaries to develop a barrier which interferes the transfer of carriers. The film according to the present invention has no or negligible amount of barriers therein since the film has lattice distortion therein. Thus, the electron mobility of the film according to the present invention is extremely increased, as compared with that of a conventional semiconductor film, to from 5 to 300 $cm^2/Vsec$.

The concentration of hydrogen in the semiconductor film according to the present invention is preferably 5 atom % or less.

The semiconductor film according to the present invention is fabricated by first depositing an amorphous (or substantially amorphous) semiconductor film on a substrate by sputtering in a 100% hydrogen atmosphere or in an atmosphere containing hydrogen as the major component and an inactive gas, and then crystallizing said amorphous semiconductor film in the temperature range of from 450° to 700° C., typically at 600° C.

The present inventors have found through an extensive study that, by carrying out the sputtering process in a controlled atmosphere containing 0.01% or less oxygen and having added therein 10% or more (in terms of partial pressure) of hydrogen [having 5N (99.999%) or higher purity], an a-Si film having uniformly incorporated therein hydrogen could be deposited, and that this film was capable of being thermally crystallized by annealing in the temperature range of from 450° to 700° C., typically at 600° C. The present invention has been accomplished based on those findings.

In accordance with one aspect of the present invention, an amorphous semiconductor film containing oxygen impurity at a concentration of $7 \times 10^{19}$ atoms·$cm^{-3}$ or less is deposited by sputtering a semiconductor target containing oxygen impurity at a concentration of $5 \times 10^{18}$ atoms·$cm^{-3}$ or less, and the resulting film is then thermally crystallized.

In accordance with another aspect of the present invention, an amorphous semiconductor film is formed by sputtering a semiconductor target containing oxygen impurity at a concentration not higher than $5 \times 10^{18}$ atoms·$cm^{-3}$ in a chamber the inner pressure of which is adjusted to a suitable pressure for sputtering, preferably, in the pressure range of from $10^{-2}$ to $10^{-4}$ Torr, by introducing a gas consisting of 100% hydrogen or a mixed gas comprising hydrogen and an inactive gas into a chamber having evacuated to a pressure of $1 \times 10^{-6}$ Torr or lower, preferably to $1 \times 10^{-9}$ Torr or lower, and the resulting film is then thermally crystallized.

DETAILED DESCRIPTION OF THE PREFERRED EMBODIMENTS

Example 1

An amorphous silicon (a-Si) film is deposited using a radio-frequency (RF) or high frequency magnetron sputtering apparatus, and then recrystallized to obtain a polycrystalline silicon semiconductor film comprising quasi-crystals (or semiamorphous film), said semiconductor film having induced therein lattice distortion, comprising crystal grains having an average diameter of from 30 Å to 4 μm, preferably from 30 Å to 400 Å, containing 5 atom % or less of hydrogen and an oxygen impurity at a concentration of $7 \times 10^{19}$ atoms·cm$^{-3}$ or lower, preferably $1 \times 10^{19}$ atoms·cm$^{-3}$ or lower.

Referring to FIGS. 1(A) to 1(E), the process for fabricating a TFT (thin film transistor) according to the present invention is described below.

Figure 1A:
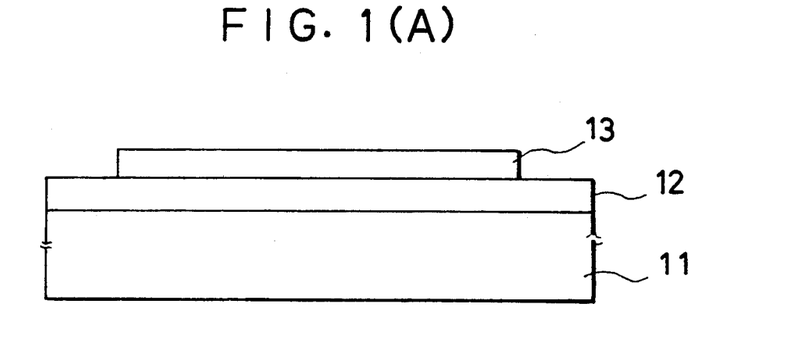
FIGS. 1(A) to 1(E) are cross sectional views which show the fabrication steps of the thin-film transistor (TFT) according to the present invention.

A 200 nm thick silicon oxide film 12 is deposited on a glass substrate 11 by RF magnetron sputtering from a single crystal silicon target under conditions as follows:
Atmosphere: 100% O$_2$
Film deposition temperature: 150° C.
RF (13.56 MHz) output power: 400 W
Pressure: 0.5 Pa.

On the silicon oxide film thus deposited is further deposited a 100 nm thick a-Si film 13 to provide a channel forming region, using an RF magnetron sputtering apparatus capable of depositing films with a low impurity concentration. The back pressure is controlled to $1 \times 10^{-6}$ Torr or lower, preferably to $1 \times 10^{-9}$ Torr or lower, by using a turbo-molecular pump and a cryopump. Gases having a purity of 5N (99.999%) or higher are supplied, and if necessary, a 4N or higher purity argon gas is used as an additive gas. The single crystal silicon to be used as the target should be also reduced in oxygen concentration to $5 \times 10^{18}$ atoms·cm$^{-3}$ or less, for example, to $1 \times 10^{18}$ atoms·cm$^{-3}$, to thereby control the oxygen impurity of the deposited film as low as possible. Deposition of the film is carried out in an atmosphere comprising from 10 to 100% of hydrogen and 90% or less of an inactive gas (e.g., argon). For example, film deposition may be conducted in a 100% hydrogen gas atmosphere. The film deposition is carried out by sputtering from a high purity silicon target under the conditions as follows:
H$_2$/(H$_2$+Ar)=100% (partial pressure ratio)
Film deposition temperature: 150° C.
RF (13.56 MHz) output power: 400 W
Total pressure: 0.5 Pa.

The a-Si film 13 thus obtained is then subjected to thermal crystallization by maintaining the film in a temperature range of from 450° to 700° C., e.g., at 600° C., for a duration of 10 hours in a hydrogen or an inert gas atmosphere. In the present example, a 100% hydrogen gas atmosphere is used. The crystallized film is a so-called microcrystalline (or semi-amorphous) film.

The a-Si film and the thermally crystallized film obtained therefrom in the present example were analysed by secondary-ion mass spectrometry (SIMS) for the impurity content. The oxygen content was found to be $8 \times 10^{18}$ atoms·cm$^{-3}$ and the carbon content was found to be $3 \times 10^{16}$ atoms·cm$^{-3}$ for the a-Si film. The hydrogen content was found to be $4 \times 10^{20}$ atoms·cm$^{-3}$ for the a-Si film; by taking the silicon density as $4 \times 10^{22}$ atoms·cm$^{-3}$, the amount of hydrogen corresponds to 1 atom %. The analyses were performed by taking the oxygen concentration of the single crystal silicon target, $1 \times 10^{18}$ atoms·cm$^{-3}$, as the standard, and the minimum value in the depth profile (concentration distribution along the direction vertical to the surface of the film) of the deposited film was taken as the representative value, since the surface of the film is easily oxidized by the atmosphere to form silicon oxide. These impurity content values remain substantially unchanged after the thermal crystallization, to give an oxygen impurity of $8 \times 10^{18}$ atoms·cm$^{-3}$ for the crystallized film. To further ascertain this, oxygen content was increased by adding, for example, 0.1 cc/sec or 10 cc/sec of N$_2$O gas flow during the film deposition. The oxygen content of the crystallized film increased to $1 \times 10^{20}$ atoms·cm$^{-3}$ or $4 \times 10^{20}$ atoms·cm$^{-3}$, corresponding to the amount of the added N$_2$O. However, those films having an increased oxygen content could only be crystallized by either elevating the annealing temperature to not lower than 700° C., or taking the annealing duration longer for 5 times or more than that of the process according to the present invention. From the viewpoint of an industrial process, a treatment at a temperature not higher than 700° C., preferably not higher than 600° C., is requisite considering the softening point of glass substrates, and it is also important to shorten the process time. However, it was found experimentally impossible to crystallize a-Si semiconductor films at 450° C. or lower by a mere reduction of the concentration of the impurities such as oxygen.

Furthermore, the present invention is realized by the use of a high quality sputtering apparatus. Thus, if a leak or some failure should occur to increase the oxygen concentration to $1 \times 10^{20}$ atoms·cm$^{-3}$ or higher during the film deposition, such high quality semiconductor films according to the present invention may not result.

It can be seen from the foregoing that a control of an oxygen impurity concentration to $7 \times 10^{19}$ atoms·cm$^{-3}$ or less within the semiconductor film and a crystallization of the film in the temperature range of from 450° to 700° C. are requisite for the realization of the present invention.

In fabricating films of germanium or of a compound semiconductor of germanium and silicon, the annealing temperature for crystallization may be lowered, by about 100° C. than the temperature range set forth above.

The thermally crystallized semiconductor films thus obtained comprise therein lattice distortion. The laser Raman spectra of such films yield peaks shifted to the lower wavenumber side as compared with the peak obtained in the spectrum for a single crystal silicon (see FIG. 4).

The fabrication process of an insulated gate field effect transistor (FET) is described below.

First, the thermally crystallized silicon semiconductor film according to the present invention is subjected to deviceseparation patterning to obtain a structure as shown in FIG. 1(A). Then, 50 nm thick n+ a-Si semiconductor films 14 are deposited on the thermally crystallized silicon semiconductor film 13 by RF magnetron sputtering from a single crystal silicon target (containing $1 \times 10^{18}$ atoms·cm$^{-3}$ of oxygen) in an atmosphere comprising, in terms of partial pressure, from 10 to 99% or higher hydrogen (80% in the present example), 90% or lower argon (19% in the present example), and from 0.1 to 10% PH$_3$ (1% in the present example), under conditions as follows:

Film deposition temperature: 150° C.
RF (13.56 MHz) output power: 400 W
Total pressure: 0.5 Pa.

The n+ a-Si semiconductor film described above may otherwise be deposited by a PCVD process. Furthermore, after the formation of an active layer, doping of impurities such as boron (B), phosphorus (P), and arsenic (As) may be carried out by ion implanatation to provide a source and a drain.

Figure 1B:
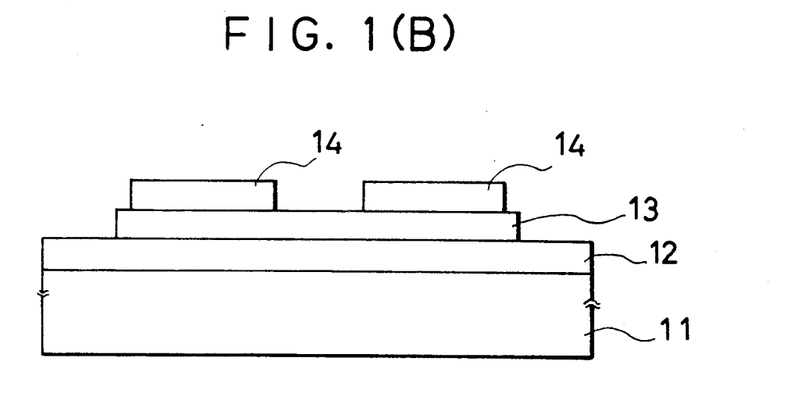
Figure 1C:
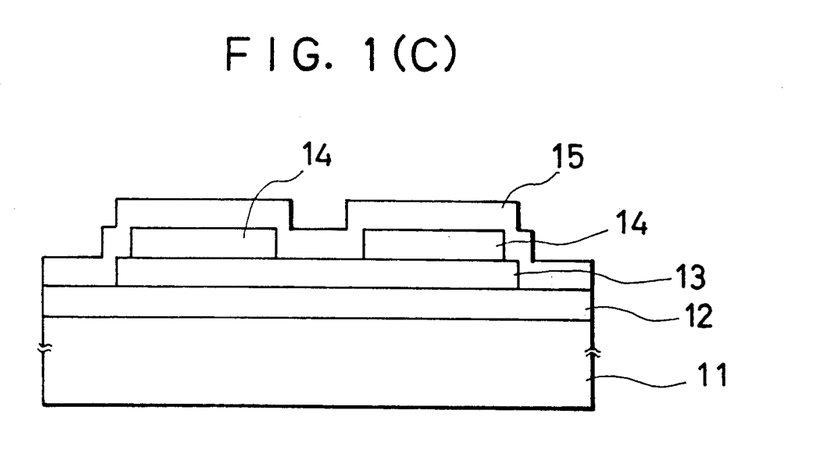

The n+ a-Si film 14 thus obtained is then patterned to obtain a structure as illustrated in FIG. 1(B). As shown in FIG. 1(C), a 100 nm thick silicon oxide film (gate insulator) 15 is deposited thereon by RF magnetron sputtering from a single crystal silicon target or a synthesized quartz target in 100% oxygen atmosphere, under conditions as follows:

Film deposition temperature: 100° C.
RF (13.56 MHz) output power: 400 W
Total pressure: 0.5 Pa.

Figure 1D:
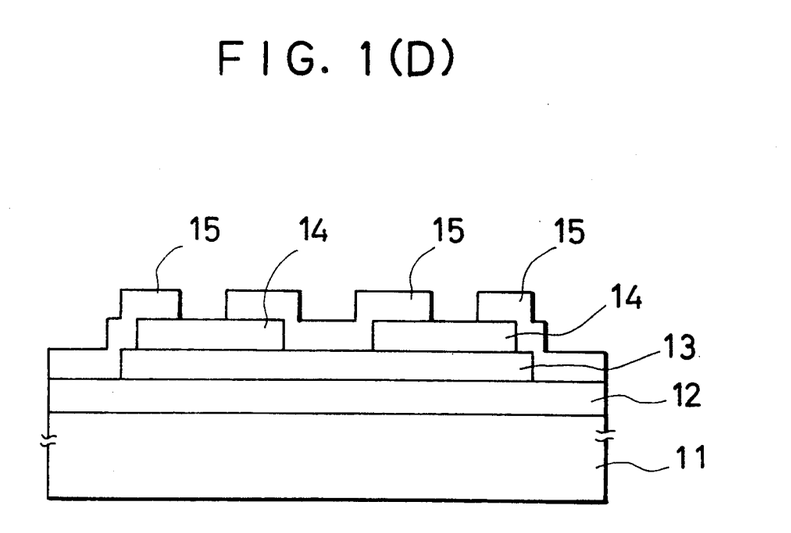
Figure 1E:
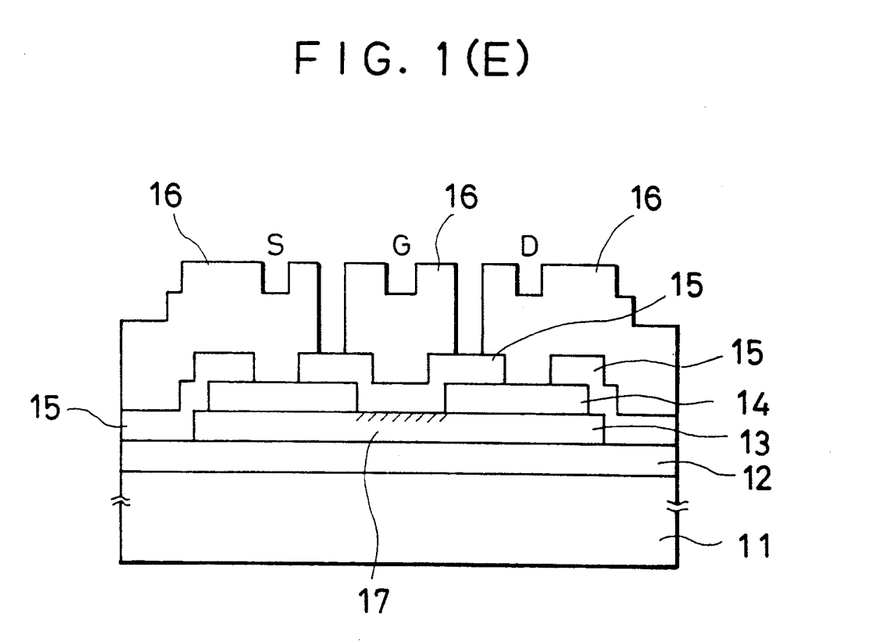

Next, contact holes are opened in the film by patterning as shown in FIG. 1(D). The TFT is finished to a structure as shown in FIG. 1(E) by depositing a 300 nm thick aluminum film 16 by vacuum deposition on the structure shown in FIG. 1(D), patterning the aluminum film, and thermally annealing the whole structure in 100% hydrogen at 375° C. for a duration of 30 minutes. The thermal annealing in hydrogen is applied to the device to improve the device characteristics by lowering the interface level between the thermally crystallized silicon semiconductor film and the silicon oxide insulator film.

Referring to the TFT shown in FIG. 1(E), S, G, and D represent a source electrode, a gate electrode, and a drain electrode, respectively. A 100×100 μm channel portion 17 (FIG. 1(E)) is provided in the TFT of the present example.

In addition to the foregoing example describing a process according to the present invention, four more examples to further illustrate the effect of the present invention are described below. TFTs are fabricated in the following Examples, with the conditions for depositing the a-Si layer 13 (see FIG. 1(A)) using RF magnetron sputtering being varied from an Example to another by changing the ratio of hydrogen in a sputtering atmosphere and the concentration of the oxygen involved in the deposited layer.

Example 2

The same TFT fabrication process as in Example 1 is carried out, except for changing the atmospheric condition during the sputtering for depositing the channel forming region 13 in FIG. 1(A) to give a mixed gas ratio (in terms of partial pressure) as follows:

$$H_2/(H_2+Ar)=0\%$$

The deposited film thus obtained contained oxygen at a concentration of $2 \times 10^{20}$ atoms·cm$^{-3}$.

Example 3

The same TFT fabrication process as in Example 1 is carried out, except for changing the atmospheric condition during the sputtering for depositing the channel forming region 13 in FIG. 1(A) to give a mixed gas ratio (in terms of partial pressure) as follows:

$$H_2/(H_2+Ar)=20\%.$$

The deposited film thus obtained contained oxygen at a concentration of $7 \times 10^{19}$ atoms·cm$^{-3}$.

Example 4

The same TFT fabrication process as in Example 1 is carried out, except for changing the atmosphere condition during the sputtering for depositing the channel forming region 13 in FIG. 1(A) to give a mixed gas ratio (in terms of partial pressure) as follows:

$$H_2/(H_2+Ar)=50\%.$$

The deposited film thus obtained contained oxygen at a concentration of $3 \times 10^{19}$ atoms·cm$^{-3}$.

Example 5

The same TFT fabrication process as in Example 1 is carried out, except for changing the atmospheric condition during the sputtering for depositing the channel forming region 13 in FIG. 1(A) to give a mixed gas ratio (in terms of partial pressure) as follows:

$$H_2/(H_2+Ar)=80\%$$

The deposited film thus obtained contained oxygen at a concentration of $1 \times 10^{19}$ atoms·cm$^{-3}$.

The electric properties of the films obtained in the foregoing Examples are compared below.

Figure 2:
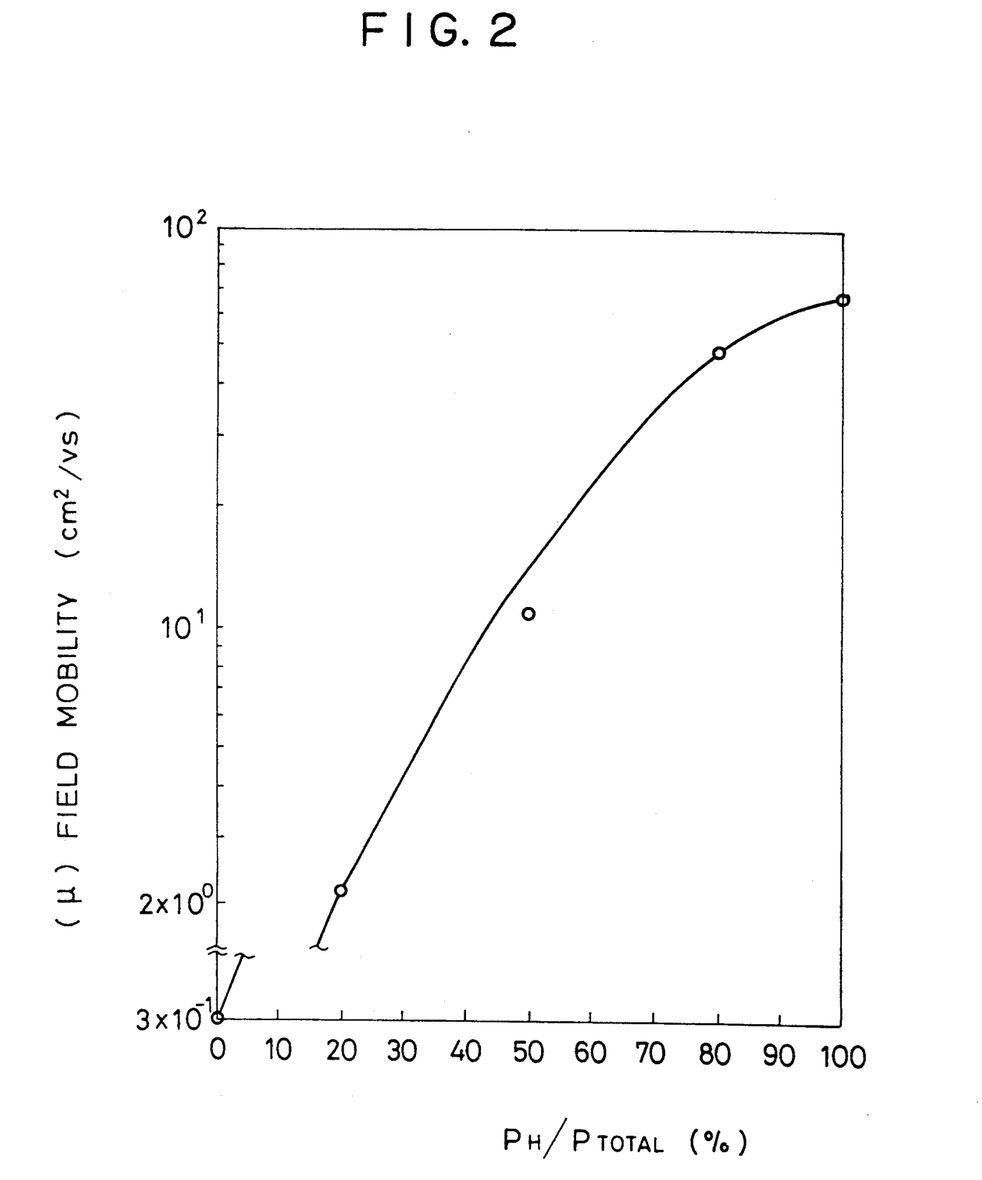
FIG. 2 is a diagram which relates the field mobility of the TFT to the ratio of hydrogen partial pressure to total atmospheric pressure ($P_H/P_{TOTAL}$) during sputtering.

FIG. 2 is a diagram which shows the relation between the carrier field mobility, μ, in the channel portion (indicated with numeral 17 in FIG. 1(E)) of each of the TFTs of Examples 1 to 5, and the hydrogen partial pressure ratio ($P_H/P_{TOTAL}=H_2/(H_2+Ar)$). The plots in FIG. 2 and their corresponding Examples are listed in Table 1 below.

TABLE 1

| $P_H/P_{TOTAL}$ (%) | No. of Example |
|---|---|
| 0 | 2 |
| 20 | 3 |
| 50 | 4 |
| 80 | 5 |
| 100 | 1 |

Referring to FIG. 2, the film deposited under a hydrogen partial pressure of 0% yields a field mobility, μ, as low as $3 \times 10^{-1}$ cm$^2$/Vsec, since the oxygen concentration of the film is as high as $2 \times 10^{20}$ atoms·cm$^{-3}$. In contrast, a noticeably high field mobility, μ, of 2 cm$^2$/Vsec or even higher can be obtained in the films which are deposited under a hydrogen partial pressure of 20% or higher and have an oxygen concentration of $7 \times 10^{19}$ atoms·cm$^{-3}$ or less. Such an effect is assumably ascribed to the addition of hydrogen and to the use of a cryopump; that is, the hydrogen reacts with oxygen inside the chamber during the sputtering to yield water, and the resulting water is then effectively removed by the cryopump.

Figure 3:
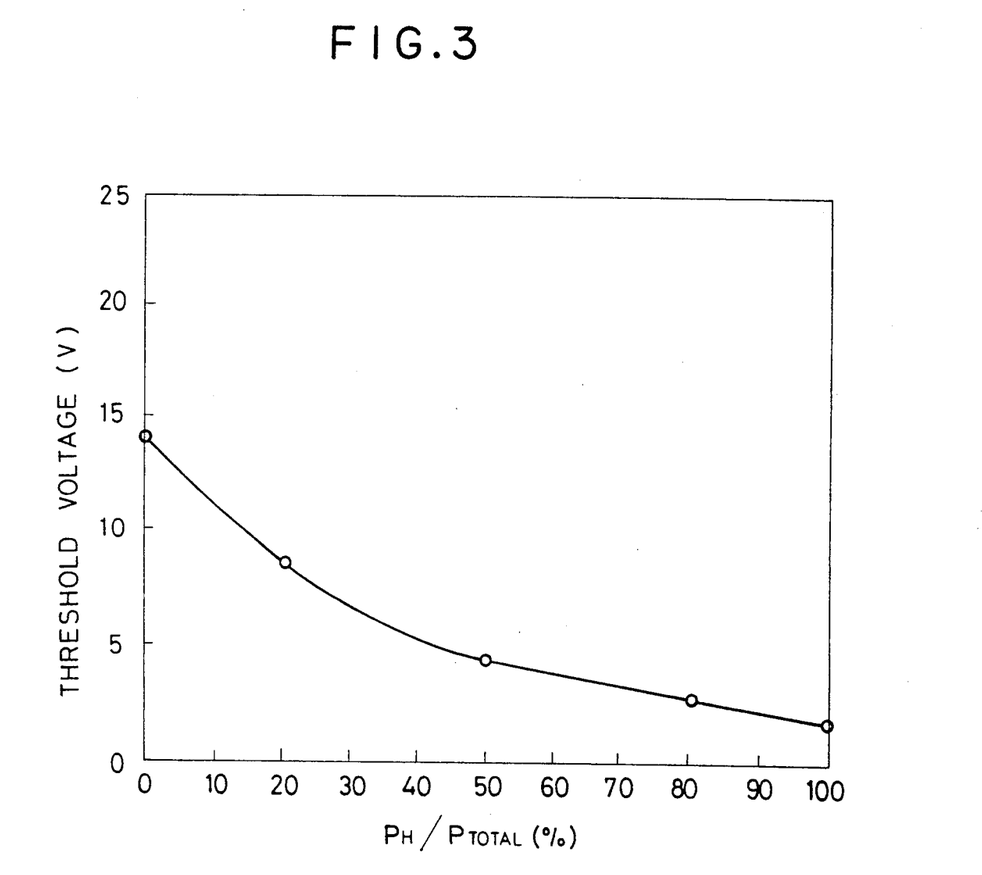
FIG. 3 is a diagram which relates the threshold voltage of the TFT to the ratio of hydrogen partial pressure to total atmospheric pressure ($P_H/P_{TOTAL}$) during sputtering.

Referring to FIG. 3, a diagram which relates the threshold voltage to the hydrogen partial pressure ratio ($P_H/P_{TOTAL} = H_2/(H_2+Ar)$) is shown. The hydrogen partial pressure ratio ($P_H/P_{TOTAL} = H_2/(H_2+Ar)$) and the corresponding number of the Example can be found in Table 1 above. The lower the threshold voltage, the lower can be achieved the gate voltage. It can be said, therefore, the lower threshold voltage, the more favorable as a device. According to the results shown in FIG. 3, a normally off state with a threshold voltage of 8 V or lower is obtained on a film having deposited by a sputtering conducted under an atmosphere containing high hydrogen partial pressure of 20% or more. This signifies that devices (TFTs in the present examples) which yield favorable electric characteristics can be obtained by using a silicon semiconductor film having obtained by crystallizing an a-Si film once deposited as the channel forming region 13 as shown in FIG. 1(A).

Figure 4:
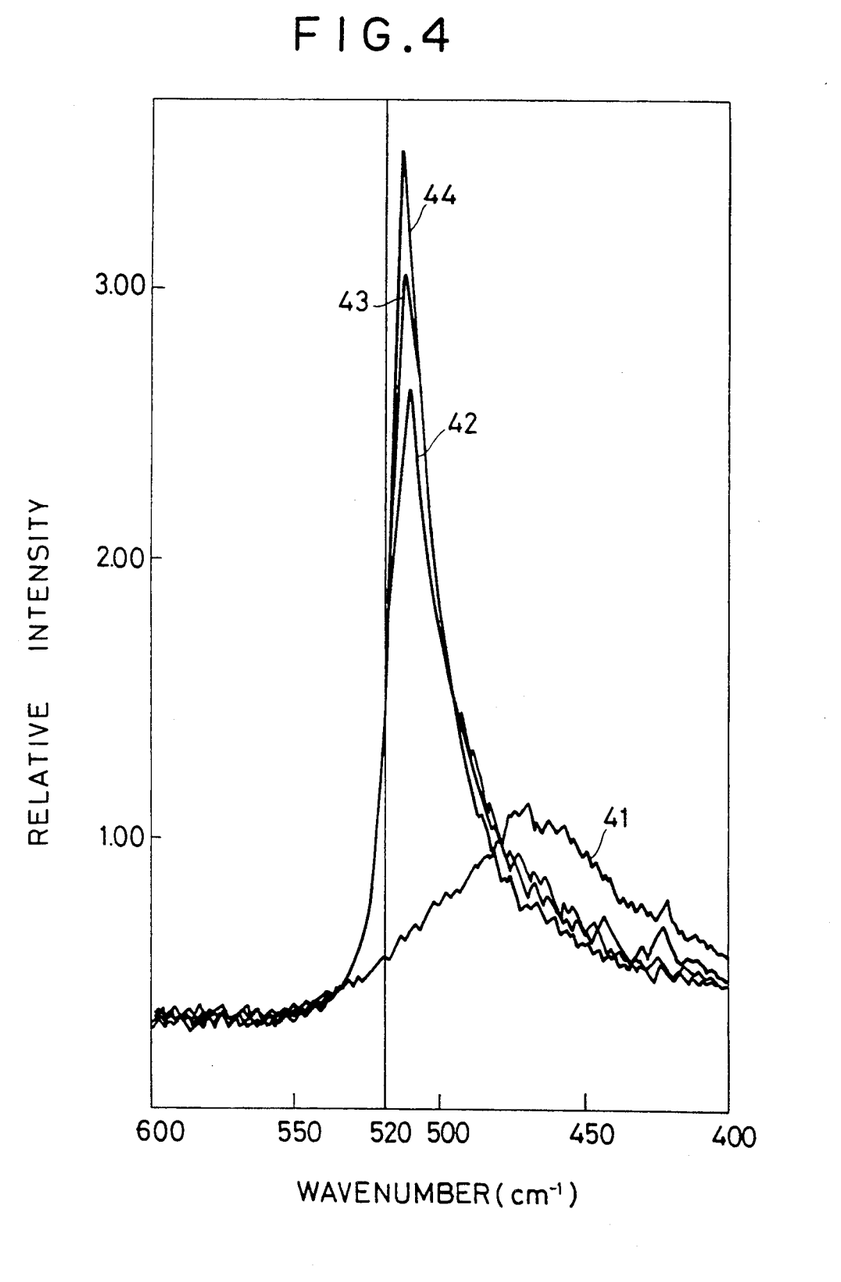
FIG. 4 shows laser Raman spectra of the thermally crystallized silicon semiconductor film.

In FIG. 4 are given laser Raman spectra of the silicon semiconductor films obtained by thermally crystallizing a-Si films. The numerals attached to the spectra in the FIGURE, the corresponding number of the Examples and the hydrogen partial pressure used therein are listed in Table 2 below.

TABLE 2

| Numerals in the FIGURE | No. of Examples | Hydrogen Partial Pressure |
| --- | --- | --- |
| 41 | 2 | 0% |
| 42 | 3 | 20% |
| 43 | 4 | 50% |
| 44 | 1 | 100% |

In FIG. 4, by comparing the spectrum 43 or 44 with the spectrum 42 or 41, it can be seen that the film sputtered under 100% hydrogen apparently crystallizes to yield crystal grains of high crystallinity as observed by its Raman spectrum, said grains having an average diameter of from 30 to 400 Å, preferably in the average diameter range of from 100 to 200 Å, as calculated from the half band width of the spectrum. Since the peak value of this film is shifted to the lower wavenumber side with respect to the peak (520 cm$^{-1}$) of a single crystal silicon, it is also clear that a lattice distortion is imparted to the grains. Those results most clearly show the characteristics of the present invention. That is, the a-Si film deposited by sputtering under an atmosphere in the presence of hydrogen has effect only when it is subjected to thermal crystallization. Since the lattice of the crystal grains are distorted, the fine crystals impose a compression force to each other. This signifies that a more intimate contact of the grains is realized at the grain boundaries; thus, the accumulation of impurities such as oxygen and the development of an energy barrier for carriers become less liable to occur at such grain boundaries. Accordingly, a high carrier field mobility can be expected in such films.

The thermally crystallized semiconductor film in accordance with the present invention can also be characterized by an average diameter calculated from half band width of X-ray diffraction spectrum thereof instead of the half band width of Raman spectrum described above. The average diameter calculated from half band width of X-ray diffraction spectrum of the thermally crystallized semiconductor film in accordance with the present invention is from 30 Å to 4 μm, preferably from 30 Å to 400 Å.

Generally in a TFT which is a field effect transistor, the drain current $I_D$ can be related to the drain voltage $V_D$ by the following equation if the drain voltage $V_D$ is low [Solid State Electronics, Vol.24, No.11, (1981) pp.1059, printed in Britain];

$$I_D = (W/L)\mu C(V_G - V_T)V_D$$

wherein, W represents the channel width, L represents the channel length, μ represents the field mobility, C represents the capacity of the gate oxide film, $V_G$ represents the gate voltage, and $V_T$ represents the threshold voltage.

In the foregoing examples, Ar (argon) was used as the inactive gas at the sputtering. However, the inactive gas is not limited thereto and other gases such as He (helium); also, plasmas of reactive gases such as SiH$_4$ and Si$_2$H$_6$ may be added to the sputtering atmosphere partially. The a-Si film may be deposited by RF magnetron sputtering under any condition as desired, provided that each of the conditions satisfy the following range: a hydrogen partial pressure ratio of from 10 to 100%, a film deposition temperature of from room temperature to 500° C., an RF output of from 500 to 100 GHz, and an output power of from 100 W to 10 MW. Furthermore, the sputtering apparatus may be combined with a pulsed energy generator. A powerful light beam (having a wavelength in the range of from 100 to 500 nm) may further be irradiated simultaneously to conduct photo-sputtering.

The processes proposed above enable formation of a hydrogen plasma from a light-weight atom hydrogen to thereby efficiently produce positive ions useful in sputtering. In such a way, hydrogen or a hydrogen atom may be uniformly dispersed in the film during deposition by sputtering, which results in a film reduced in oxygen content to $7 \times 10^{19}$ atoms·cm$^{-3}$ or less, preferably to $1 \times 10^{19}$ atoms·cm$^{-3}$ or less. Furthermore, the reactive gasses mentioned hereinbefore can be used in these processes as well.

In the foregoing Examples, an a-Si film was used as the amorphous semiconductor film. However, the present invention is also applicable to a film of a germanium or compound semiconductor represented by Si$_x$Ge$_{1-x}$ (0 < x < 1). These films may be a p-type, an n-type, or an intrinsic semiconductor.

While the invention has been described in detail and with reference to specific embodiments thereof, it will be apparent to one skilled in the art that various changes and modifications can be made therein without departing from the spirit and scope thereof.

What is claimed is:

1. A method for manufacturing a semiconductor device comprising:
    forming an amorphous semiconductor film containing oxygen impurity at a concentration not higher than $7 \times 10^{19}$ atoms·cm$^{-3}$ by sputtering a semiconductor target containing oxygen impurity at a concentration not higher than $5 \times 10^{18}$ atoms·cm$^{-3}$ in an atmosphere comprising hydrogen at not less than 10% in terms of partial pressure; and
    crystallizing said amorphous semiconductor film at a temperature of 450° C. to 700° C.

2. The method of claim 1 wherein the crystallized semiconductor film has lattice distortion therein and comprises crystal grains having an average diameter of 30 Å to 4 μm as viewed from the upper surface of said crystallized semiconductor film.

3. The method of claim 2 wherein said average diameter is calculated from half band width selected from the group consisting of half band width of Raman spectrum of said crystallized semiconductor film and half band width of X-ray diffraction spectrum of said crystallized semiconductor film.

4. The method of claim 1 wherein said atmosphere further comprises an inactive gas at not more than 90% in terms of partial pressure.

5. The method of claim 4 wherein said inactive gas comprises a gas selected from the group consisting of argon and helium.

6. The method of claim 1 wherein said semiconductor target comprises silicon.

7. The method of claim 1, wherein said crystallizing step is performed in a manner imparting an electron mobility to the resulting semiconductor film of from 5 to 300 cm$^2$/Vsec.

8. A method for manufacturing a semiconductor device comprising:
    evacuating a chamber to a pressure of $1 \times 10^{-6}$ torr or less;
    introducing a gas comprising hydrogen into said chamber to a sputtering pressure;
    forming an amorphous semiconductor film by sputtering at said sputtering pressure a semiconductor target containing oxygen impurity at a concentration not higher than $5 \times 10^{18}$ atoms·cm$^{-3}$; and
    crystallizing said amorphous semiconductor film at a temperature of 450° C. to 700° C.,
    wherein the sputtering is carried out in an atmosphere comprising hydrogen at not less than 10% in terms of partial pressure.

9. The method of claim 8 wherein the crystallized semiconductor film has lattice distortion therein and comprises crystal grains having an average diameter of 30 Å to 4 μm as viewed from the upper surface of said crystallized semiconductor film.

10. The method of claim 9 wherein said average diameter is calculated from half band width selected from the group consisting of half band width of Raman spectrum of said crystallized semiconductor film and half band width of X-ray diffraction spectrum of said crystallized semiconductor film.

11. The method of claim 8 wherein said gas further comprises an inactive gas and said atmosphere further comprises an inactive gas at not more than 90% in terms of partial pressure.

12. The method of claim 11 wherein the inactive gas comprises a gas selected from the group consisting of argon and helium.

13. The method of claim 8 wherein said semiconductor target comprises silicon.

14. The method of claim 8 wherein said sputtering pressure is from $10^{-2}$ to $10^{-4}$ torr.

15. The method of claim 8 wherein said gas comprises only hydrogen.

16. The method of claim 8, wherein said crystallizing step is performed in a manner imparting an electron mobility to the resulting semiconductor film of from 5 to 300 cm$^2$/Vsec.

* * * * *